(12) United States Patent
Kinsman

(10) Patent No.: US 7,629,686 B2
(45) Date of Patent: *Dec. 8, 2009

(54) BUMPED DIE AND WIRE BONDED BOARD-ON-CHIP PACKAGE

(75) Inventor: Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 96 days.

This patent is subject to a terminal disclaimer.

(21) Appl. No.: 11/523,915

(22) Filed: Sep. 20, 2006

(65) Prior Publication Data

US 2007/0013084 A1    Jan. 18, 2007

Related U.S. Application Data

(60) Continuation of application No. 10/792,229, filed on Mar. 3, 2004, now Pat. No. 7,116,001, which is a division of application No. 10/092,276, filed on Mar. 5, 2002, now Pat. No. 6,744,137, which is a division of application No. 09/863,245, filed on May 21, 2001, now Pat. No. 6,528,408.

(51) Int. Cl.
*H01L 23/48* (2006.01)
*H01L 23/495* (2006.01)

(52) U.S. Cl. .................. 257/737; 257/738; 257/777; 257/778; 257/786; 257/E21.053; 257/E23.04; 257/E23.063; 438/613

(58) Field of Classification Search .......... 257/737, 257/738, 777, 778, 786; 438/613
See application file for complete search history.

(56) References Cited

U.S. PATENT DOCUMENTS

| | | | |
|---|---|---|---|
| 3,811,186 A | 5/1974 | Larnerd et al. | |
| 4,940,181 A | 7/1990 | Juskey, Jr. et al. | |
| 5,323,060 A | 6/1994 | Fogal et al. | |
| 5,329,423 A | 7/1994 | Scholz | |
| 5,410,181 A | 4/1995 | Zollo et al. | |
| 5,477,086 A | 12/1995 | Rostoker et al. | |
| 5,534,467 A * | 7/1996 | Rostoker | 29/827 |
| 5,598,031 A | 1/1997 | Groover et al. | |
| 5,674,785 A | 10/1997 | Akram | |
| 5,719,440 A | 2/1998 | Moden | |
| 5,744,383 A | 4/1998 | Fritz | |
| 5,777,391 A | 7/1998 | Nakamura et al. | |
| 5,811,879 A | 9/1998 | Akram | |
| 5,891,753 A | 4/1999 | Akram | |
| 5,917,242 A | 6/1999 | Ball | |

(Continued)

*Primary Examiner*—Dao H Nguyen
(74) *Attorney, Agent, or Firm*—TraskBritt

(57) ABSTRACT

An apparatus for making a semiconductor assembly and, specifically, interconnecting a semiconductor die to a carrier substrate. The carrier substrate includes a first surface and a second surface with at least one opening therethrough. The die includes an active surface and a back surface, wherein the die is attached face down to the first surface of the carrier substrate with conductive bumps therebetween. In addition, a plurality of bond wires is attached through the at least one opening in the carrier substrate between the active surface of the die and the second surface of the carrier substrate. With this arrangement, both the conductive bumps and the bond wires share in the electrical interconnection between the die and the carrier substrate, thereby allowing more space for bond pads to interconnect with bond wires and/or allowing for smaller die sizes.

43 Claims, 6 Drawing Sheets

U.S. PATENT DOCUMENTS

| | | |
|---|---|---|
| 5,936,305 A | 8/1999 | Akram |
| 5,973,403 A | 10/1999 | Wark |
| 5,990,565 A | 11/1999 | Chang |
| 6,011,307 A | 1/2000 | Jiang et al. |
| 6,048,755 A | 4/2000 | Jiang et al. |
| 6,051,878 A | 4/2000 | Akram et al. |
| 6,081,037 A | 6/2000 | Lee et al. |
| 6,133,626 A | 10/2000 | Hawke et al. |
| 6,144,101 A | 11/2000 | Akram |
| 6,157,086 A | 12/2000 | Weber |
| 6,218,731 B1 * | 4/2001 | Huang et al. ................. 257/738 |
| 6,228,679 B1 | 5/2001 | Chiu |
| 6,265,766 B1 | 7/2001 | Moden |
| 6,294,838 B1 | 9/2001 | Peng |
| 6,528,408 B2 * | 3/2003 | Kinsman .................... 438/613 |
| 6,630,730 B2 | 10/2003 | Grigg |
| 6,744,137 B2 * | 6/2004 | Kinsman .................... 257/737 |
| 7,115,990 B2 * | 10/2006 | Kinsman .................... 257/737 |
| 7,116,001 B2 * | 10/2006 | Kinsman .................... 257/786 |

* cited by examiner

BUMPED DIE AND WIRE BONDED BOARD-ON-CHIP PACKAGE

CROSS-REFERENCE TO RELATED APPLICATIONS

This application is a continuation of application Ser. No. 10/792,229, filed Mar. 3, 2004, now U.S. Pat. No. 7,116,001, issued Oct. 3, 2006, which is a divisional of application Ser. No. 10/092,276, filed Mar. 5, 2002, now U.S. Pat. No. 6,744,137, issued Jun. 1, 2004, which is a divisional of application Ser. No. 09/863,245, filed May 21, 2001, now U.S. Pat. No. 6,528,408, issued Mar. 4, 2003.

BACKGROUND OF THE INVENTION

1. Field of the Invention

The present invention relates to a method and apparatus for interconnecting a semiconductor die or semiconductor device to a carrier substrate. In particular, the present invention relates to a method and apparatus for attaching a semiconductor die face down to a carrier substrate so that the semiconductor die is electrically interconnected to the carrier substrate using both conductive bumps and bond wires.

2. State of the Art

Well-known techniques typically used for bonding and electrically connecting a semiconductor die to a substrate, such as a printed circuit board, interposer, or carrier substrate, are flip-chip attachment, wire bonding, and tape automated bonding ("TAB"). Such techniques are known in the art as Chip-On-Board ("COB") or, otherwise, Board-On-Chip ("BOC") technology.

Flip-chip attachment generally consists of attaching an active surface of a semiconductor die to a substrate with a plurality of conductive bumps therebetween. Each conductive bump must align and correspond with respective bond pads on the substrate and the semiconductor die to provide electrical interconnection therebetween. The semiconductor die is bonded to the substrate by reflowing the conductive bumps, after which an underfill material is typically disposed between the semiconductor die and the substrate for environmental protection and to enhance the attachment of the semiconductor die to the substrate.

Although flip-chip packages exhibit excellent response time, from a production standpoint, flip-chip attachment has several challenges due to the numerous amount of conductive bumps required. In particular, if the substrate connection arrangement is not a mirror image of the conductive bumps on the semiconductor die, electrically connecting the semiconductor die to the substrate is impossible. Such a challenge is exemplified by the methods disclosed in U.S. Pat. No. 3,811,186; U.S. Pat. No. 4,940,181; U.S. Pat. No. 5,477,086; and U.S. Pat. No. 5,329,423 for self aligning the conductive bumps.

Turning to the BOC techniques of wire bonding and TAB, the semiconductor die is directly attached to the surface of a substrate, i.e., printed circuit board, interposer, or carrier substrate, with an appropriate adhesive, such as an epoxy or adhesive tape. The die may be oriented either face up or face down (with its active surface and bond pads either up or down with respect to the circuit board) for wire bonding. A plurality of bond wires is then discretely attached to each bond pad on the semiconductor die and extends to a corresponding bond pad on the substrate. The bond wires are generally attached through one of three industry-standard wire bonding techniques: ultrasonic bonding (using a combination of pressure and ultrasonic vibration bursts to form a metallurgical cold weld); thermocompression bonding (using a combination of pressure and elevated temperature to form a weld); and thermosonic bonding (using a combination of pressure, elevated temperature, and ultrasonic vibration bursts). TAB is generally employed to connect ends of metal leads carried on an insulating tape such as a polyimide respectively to the bond pads on the semiconductor die and the bond pads on the printed circuit board. For both wire bonding and TAB techniques, an encapsulant is typically used to cover the bond wires and metal tape leads to prevent contamination.

Among the different methods of wire bonding a semiconductor die to a substrate, one method includes adhesively attaching a semiconductor die to a substrate in the facedown orientation. In this orientation, the active surface of the die is adhesively attached to a portion of the substrate, i.e., printed circuit board, interposer, or carrier substrate, etc., having one or more wire bonding openings therein so that bond wires can extend through the opening from bond pads on the substrate to bond pads on the active surface of the die. For example, see U.S. Pat. No. 5,719,440, assigned to the assignee of the present invention, which discloses the die adhesively attached face down to a substrate with wire bonding through an opening in the substrate.

This facedown semiconductor die orientation is advantageous by allowing shorter wire bonds resulting in less potential for interwire contact and shorting. However, problems with this arrangement include moisture becoming trapped in the adhesive between the semiconductor die and substrate, often resulting in the package cracking when the moisture turns to steam as the package is exposed to high temperatures. Other problems include managing the power and ground wire bond interconnections and the difficult routing signals from both an integrity and reliability standpoint and, additionally, the standpoint of meeting the demands of available "real estate." In other words, since the facedown semiconductor die orientation is limited to the one or more openings in the substrate that expose the active surface of the semiconductor die for wire bond interconnections, the space on the active surface exposed by the substrate opening severely limits the number of possible interconnections that may be made via the wire bonds. Further, the wire bonds necessary for the power and ground are larger due to the increased amount of current running therethrough, thus, further compounding the available space problem for each of the wire bond interconnections.

Therefore, in light of the foregoing, it would be advantageous to provide a semiconductor package with increased integrity and reliability as well as to better manage the available space for wire bonding in a facedown-oriented semiconductor die. It would also be advantageous to provide a semiconductor package that substantially prevents trapping moisture therein.

BRIEF SUMMARY OF THE INVENTION

The present invention relates to a semiconductor assembly and is directed to the interconnections between a semiconductor die attached face down to a carrier substrate.

In a preferred embodiment of the present invention, the semiconductor assembly includes a carrier substrate having a first surface and a second surface with at least one opening in the carrier substrate that extends from the first surface to the second surface. The semiconductor die includes an active surface and a back surface, wherein the semiconductor die is attached face down to the first surface of the carrier substrate with conductive bumps therebetween. In addition, a plurality of bond wires is attached through the at least one opening in the carrier substrate between the active surface of the die and the second surface of the carrier substrate.

In one embodiment, the at least one opening is a single opening centrally located in the carrier substrate. The semiconductor die is attached face down over the opening so that centrally located bond pads on the semiconductor die are exposed through the opening and outer bond pads on the die are mirrored with bond pads on the first surface of the carrier substrate with the conductive bumps between such mirrored bond pads. With this arrangement, the plurality of bond wires is attached through the single opening centrally located in the carrier substrate between the centrally located bond pads on the active surface of the semiconductor die and the bond pads on the second surface of the carrier substrate. Therefore, the semiconductor die is electrically interconnected to the carrier substrate by both the conductive bumps and the bond wires.

In a second embodiment, the at least one opening is a plurality of openings located proximate a periphery of the carrier substrate. The semiconductor die is attached face down to the carrier substrate so that peripheral bond pads on the semiconductor die are exposed through the plurality of openings and centrally located bond pads are mirrored with bond pads on the first surface of the carrier substrate with the conductive bumps between such mirrored bond pads. With this arrangement, the plurality of bond wires is attached through the plurality of openings located proximate the periphery of the carrier substrate between the peripheral bond pads on the semiconductor die and the bond pads on the second surface of the carrier substrate. Therefore, in the second embodiment, the semiconductor die is electrically interconnected to the carrier substrate by both the conductive bumps and the bond wires.

According to the present invention, both the conductive bumps and the bond wires share in the electrical interconnection between the semiconductor die and the carrier substrate. In particular, the present invention provides that the conductive bumps include power and ground connections between the semiconductor die and the carrier substrate. Further, the conductive bumps and the plurality of bond wires each collectively include a portion of the signal routing between the semiconductor die and the carrier substrate. By arranging the conductive bumps and the bond wires to share in the electrical interconnection between the semiconductor die and substrate, there is more space on the die for bond pads and/or this arrangement allows for a smaller die size.

In the present invention, the semiconductor assembly may include a filler material disposed around the conductive bumps and between the semiconductor die and carrier substrate, which may be applied by injecting, dispensing or flowing the filler material from a dispenser. The semiconductor assembly includes a sealant or encapsulation material to at least encapsulate the plurality of bond wires. The encapsulation material may also substantially encapsulate exposed portions of the semiconductor die. Such encapsulation material may be formed on the semiconductor assembly by a transfer molding process or by a glob top process. In a transfer molding process, the encapsulation material may act as the filler material, depending on the characteristics of the encapsulation material, such as the viscosity.

In the present invention, the conductive bumps are electrical interconnections between the semiconductor die and the carrier substrate. As such, the conductive bumps may comprise any conductive material such as solder balls and/or z-axis conductive material. The conductive bumps may include layers having a core and a shell, in which the core may be a nonconductive polymer. The shell and core may also include conductive polymers, metals, and/or alloys. The conductive bumps may also be in the form of a stud bump or a column.

In another aspect of the present invention, the semiconductor assembly includes interconnect bumps on the second surface of the carrier substrate for electrical interconnection with a printed circuit board. Similar to the conductive bumps, the interconnect bumps may include any conductive material such as solder balls and/or z-axis material. The interconnect bumps may include layers having a core and a shell, in which the core may be a nonconductive polymer. The shell and core may also include conductive polymers, metals, and/or alloys. The interconnect bumps may also be in the form of a stud bump, formed from the wire bonding material, or a column.

In another aspect of the present invention, the semiconductor assembly is mounted to a circuit board in a computer or a computer system. In the computer system, the circuit board is electrically connected to a processor device that electrically communicates with an input device and an output device.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings.

FIGS. 1 through 5 illustrate a method of making a semiconductor assembly according to a first embodiment of the present invention, in which:

FIG. 1 is a simplified perspective view of a semiconductor die and a carrier substrate in an unattached position according to the present invention;

FIG. 2 is a simplified cross-sectional view of a semiconductor die attached face down to a carrier substrate with conductive bumps therebetween to form a semiconductor assembly, according to the present invention;

FIG. 3 is a simplified cross-sectional view of the semiconductor assembly as shown in FIG. 2 with filler material between the semiconductor die and the carrier substrate and bond wires extending from the semiconductor die to the carrier substrate, according to the present invention;

FIG. 4 is a simplified cross-sectional view of the semiconductor assembly as shown in FIG. 3 with an encapsulation material encapsulating the bond wires and the semiconductor die, according to the present invention;

FIG. 5 is a simplified cross-sectional view of the semiconductor assembly as shown in FIG. 4, wherein the semiconductor assembly is attached to a printed circuit board, according to the present invention;

FIGS. 6 through 8 illustrate a method of making a semiconductor assembly according to a second embodiment of the present invention, wherein FIG. 6 is a simplified perspective view of a die and a carrier substrate in an unattached position, wherein the carrier substrate includes a plurality of openings therein, according to the present invention, wherein FIG. 7 is a simplified cross-sectional view of a semiconductor die attached face down to a carrier substrate with conductive bumps and bond wires extending therebetween forming a semiconductor assembly, according to the present invention, and wherein FIG. 8 is a simplified cross-sectional view of the semiconductor assembly as shown in FIG. 7, wherein the semiconductor assembly is attached to a printed circuit board, according to the present invention.

DETAILED DESCRIPTION OF THE INVENTION

Preferred embodiments of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements and features common between the figures retain the same numerical designation.

Figure 1:
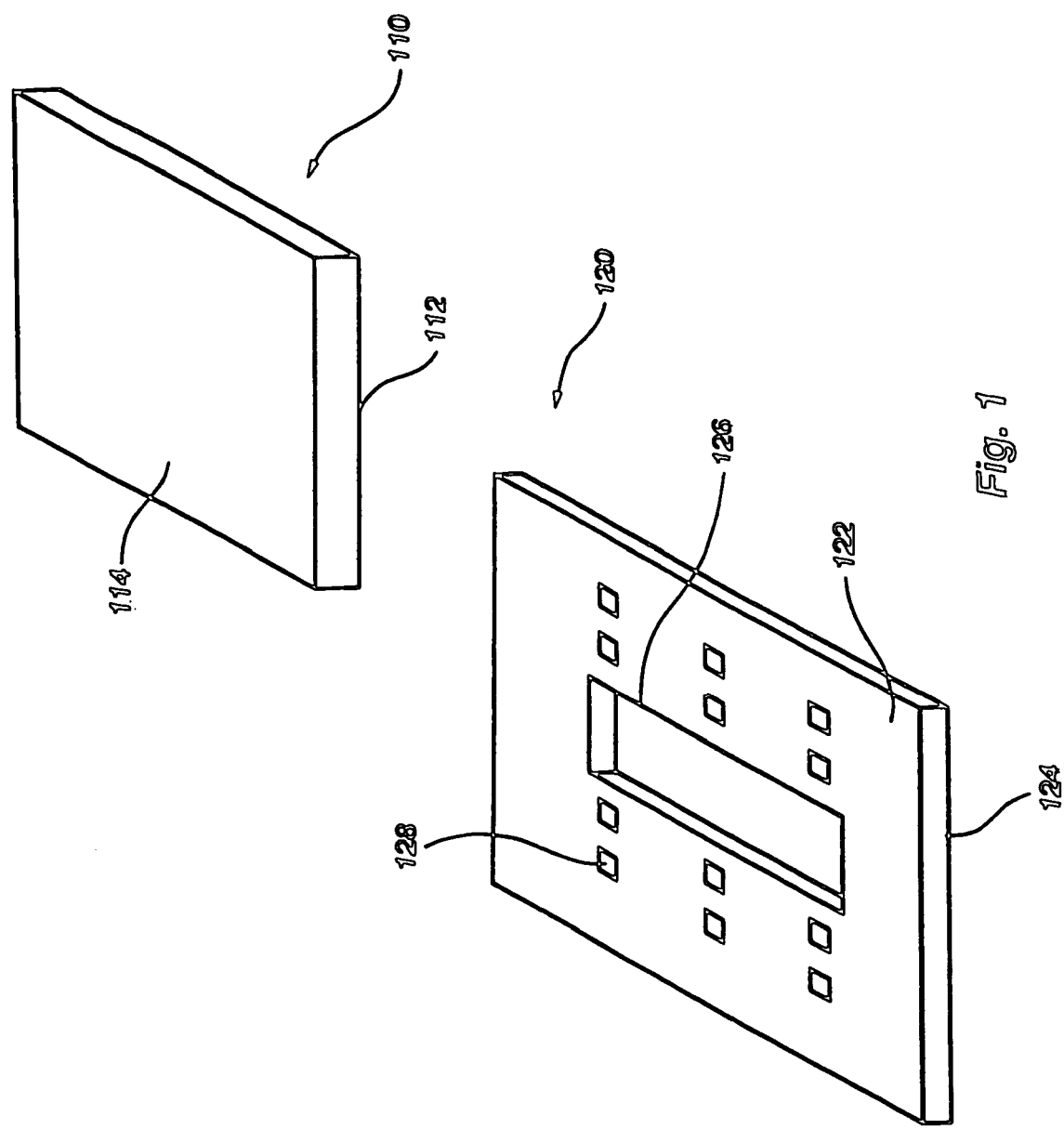

An exemplary first embodiment of the method and apparatus incorporating teachings of a semiconductor assembly is shown in drawing FIGS. 1 through 5. Depicted in drawing FIG. 1 is a simplified perspective view of a semiconductor die 110 and a carrier substrate 120 in an unattached position. The semiconductor die 110 includes an active surface 112 and a back surface 114 and is generally rectangular in shape. The semiconductor die 110 is typically made of a semiconductor material, such as germanium, lead sulfide, silicon, gallium arsenide and silicon carbide, but is not limited to such materials. The semiconductor die 110 includes integrated circuitry therein and bond pads 132 located substantially centrally in one or more rows on the active surface 112 thereof and, in addition, bond pads 132 located in peripheral outer portions on the active surface 112 thereof (see FIG. 2).

The carrier substrate 120 includes a first surface 122 and a second surface 124 with an opening 126 therein. The opening 126 is centrally located in the carrier substrate 120 and extends through and from the first surface 122 to the second surface 124 of the carrier substrate 120. The carrier substrate 120 may be any type of substrate or interposer and is typically made of various materials, such as ceramic, silicone, glass, and combinations thereof. The carrier substrate 120 includes bond pads 128 on the first surface 122 and the second surface 124 thereof (see FIGS. 1 and 2).

Figure 2:
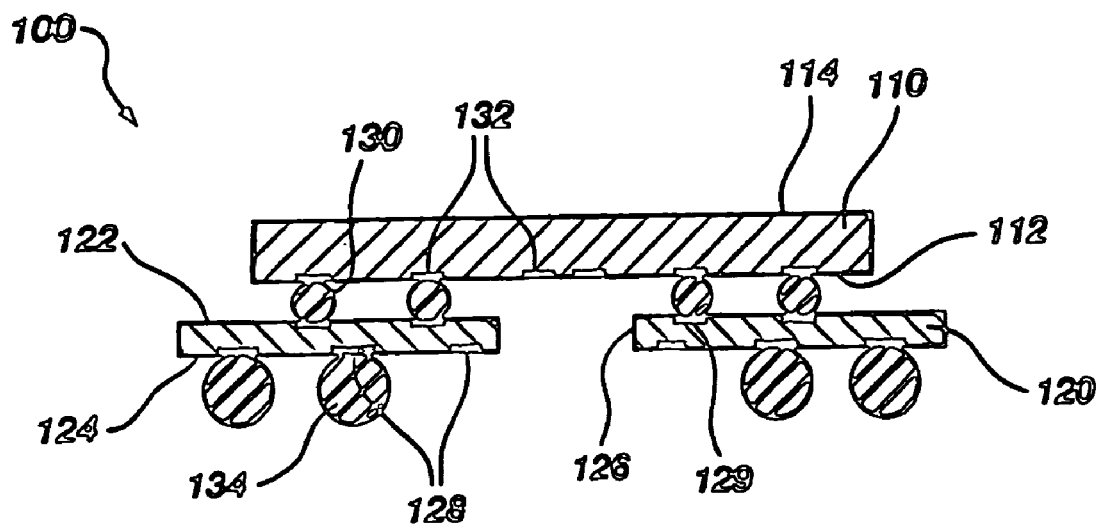

A simplified cross-sectional view of a semiconductor assembly 100 and, more specifically, of the semiconductor die 110 attached to the carrier substrate 120 is depicted in drawing FIG. 2. In particular, the semiconductor die 110, with its active surface 112 face down, is attached to the first surface 122 of the carrier substrate 120 with conductive bumps 130 sandwiched therebetween. The conductive bumps 130 are electrically interconnected and aligned between bond pads 129 on the first surface 122 of the carrier substrate 120 and bond pads 132 at peripheral outer portions of the semiconductor die's active surface 112. Further, the semiconductor die 110 is aligned such that centrally located bond pads 132 on the semiconductor die 110 are exposed through the opening 126 of the carrier substrate 120.

Preceding such alignment and attachment of the semiconductor die 110 and the carrier substrate 120, it is preferable to pre-attach the conductive bumps 130 to the respective bond pads of either the semiconductor die 110 or the carrier substrate 120. In this manner, the carrier substrate 120 or the semiconductor die 110 (without the pre-attached conductive bumps) may then be aligned and attached to the pre-attached conductive bumps 130 on either the semiconductor die 110 or carrier substrate 120 using conventional aligning techniques known in the art. The attached assembly is then heated to a suitable predetermined temperature, determined by the material properties of the conductive bumps 130, to reflow the conductive bumps 130 to bond and electrically interconnect the semiconductor die 110 and carrier substrate 120.

In addition, drawing FIG. 2 depicts interconnect bumps 134, which are generally larger than the conductive bumps 130, attached to the second surface 124 of the carrier substrate 120. For alignment purposes, the interconnect bumps 134 are preferably pre-attached to the carrier substrate 120. The interconnect bumps 134 are made for attaching the semiconductor assembly to another substrate such as a printed circuit board (see FIG. 5), which will be discussed in further detail hereafter.

The conductive bumps 130 are preferably shaped as balls, but may be shaped as pillars, columns, and/or studs. The conductive bumps 130 may be formed of any known conductive material or alloy thereof, such as solder, lead, tin, copper, silver and/or gold and conductive polymers and/or conductive composites. The conductive bumps 130 may include a core having layers thereon utilizing such materials and/or alloys thereof. As such, the conductive bumps 130 act as electrical interconnections between the semiconductor die 110 and the carrier substrate 120. The conductive bumps 130 preferably employed are solder balls, stud bumps, and/or bumps formed from a z-axis conductive material. In addition, the previously set forth interconnect bumps 134 may have the same physical and electrical characteristics as the conductive bumps 130.

Figure 3:
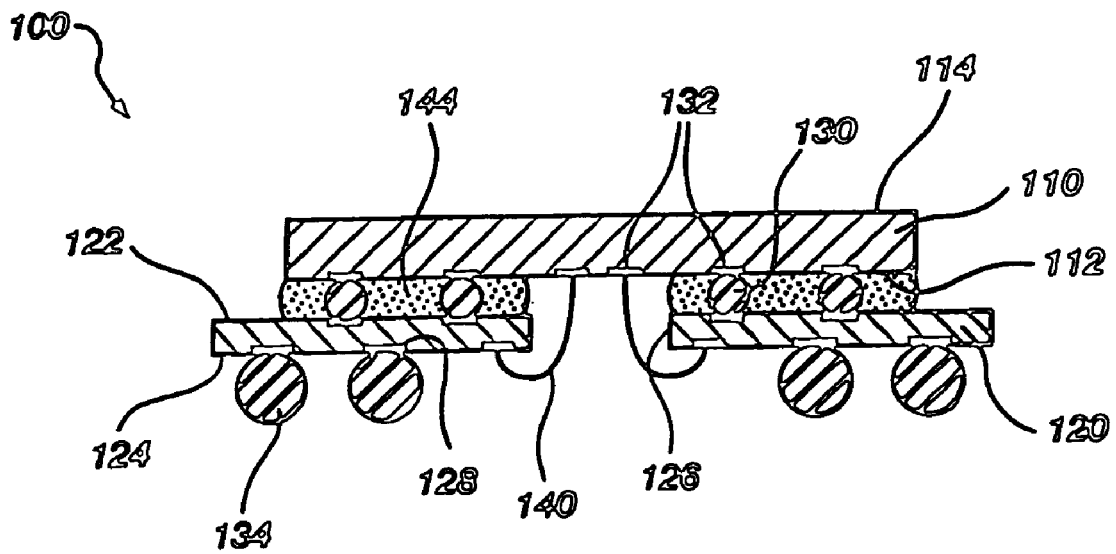

With the semiconductor die 110 attached to the carrier substrate 120, the semiconductor assembly is prepared for an underfill process and wire bonding, as shown in drawing FIG. 3. The underfill process may be accomplished by employing methods of injecting, dispensing or flowing a filler material 144 or any known method to those skilled in the art. For example, such methods may include applying the filler material 144 in the gap between the semiconductor die 110 and the carrier substrate 120 and allowing the filler material 144 to fill the gap by capillary action and/or pressure flow. Although the filler material 144 is not required, it is preferred so as to protect the conductive bumps 130 from the environment.

In addition, as shown in drawing FIG. 3, the semiconductor die 110 is wire bonded to the carrier substrate 120. In particular, bond wires 140 are made to extend through the opening 126 and attach between the centrally located bond pads 132 on the semiconductor die 110 exposed through the opening 126 and the bond pads 128 on the second surface 124 of the carrier substrate 120. The wire bonding may be employed by any known method such as ultrasonic bonding, thermocompression bonding and thermosonic bonding. Therefore, with this arrangement as depicted in drawing FIG. 3, the semiconductor die 110 is electrically interconnected to the carrier substrate 120 by both the bond wires 140 and the conductive bumps 130.

Figure 4:
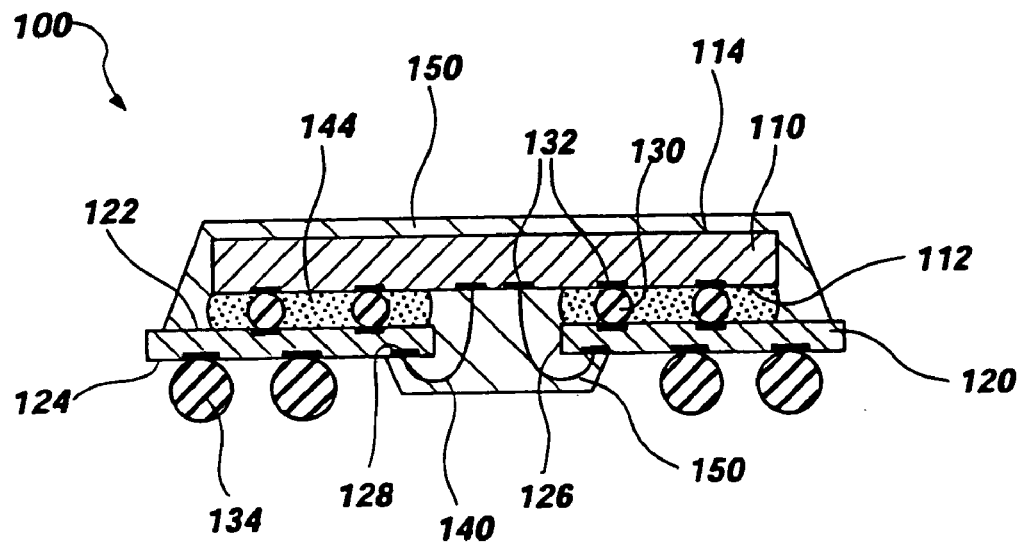

As shown in drawing FIG. 4, vulnerable components in the semiconductor assembly are sealed in an encapsulation material 150 such as a resin. In particular, after wire bonding the semiconductor die 110 to the carrier substrate 120, the bond wires 140 and/or exposed portions of the semiconductor die 110 are preferably sealed with an encapsulation material 150. The encapsulation material 150 is typically disposed over the semiconductor assembly through a transfer molding process as known in the art. Depending on the characteristics of the encapsulation material, i.e., viscosity, used in a transfer molding process, the filler material 144 may be replaced by the encapsulation material 150, as the encapsulation material 150 may fill the gap between the semiconductor die 110 and the carrier substrate 120. However, at a minimum, the encapsulation material 150 should be applied to at least seal the bond wires 140 and their interconnections.

Other methods for providing the encapsulation material 150 or resin around the bond wires 140 may be applied such as a glob top process as known in the art. For example, such a glob top process may be employed by disposing the encapsulation material 150 into the opening 126 of the carrier substrate 120 to, thereby, seal the bond wires 140 and each of their respective interconnections on the semiconductor die 110 and the carrier substrate 120.

Figure 5:
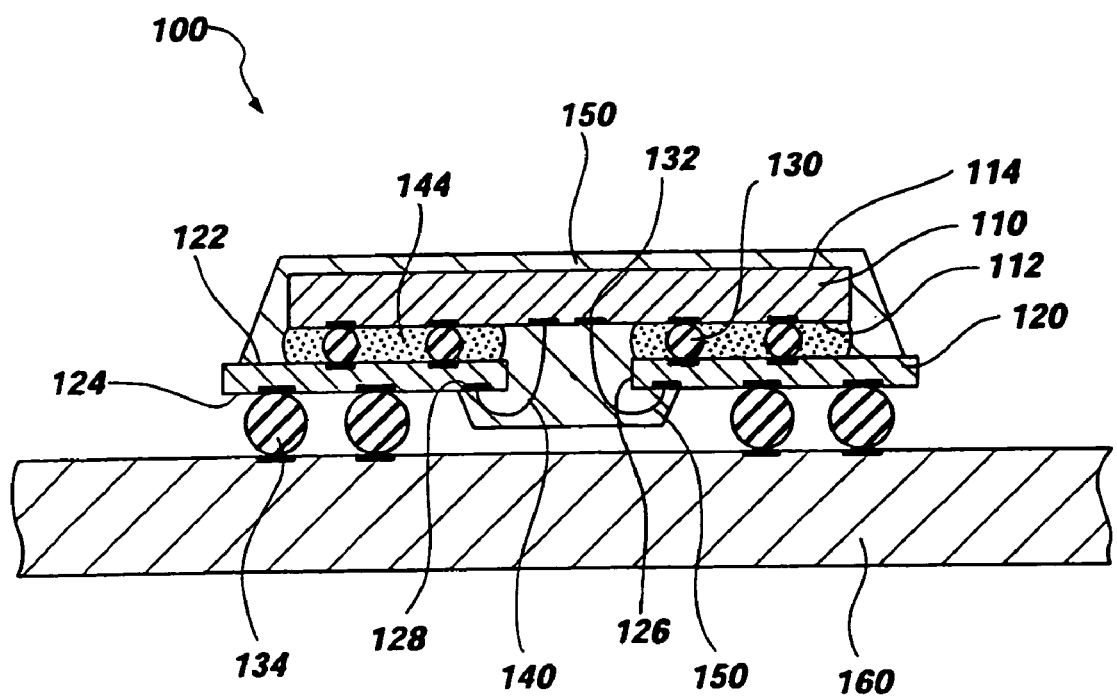

After the encapsulation material 150 has been formed on the semiconductor assembly 100, the assembly may be attached to a printed circuit board 160 with the interconnect bumps 134 located between the second surface 124 of the carrier substrate 120 and the upper surface of the printed circuit board 160 as shown in drawing FIG. 5.

Figure 6:
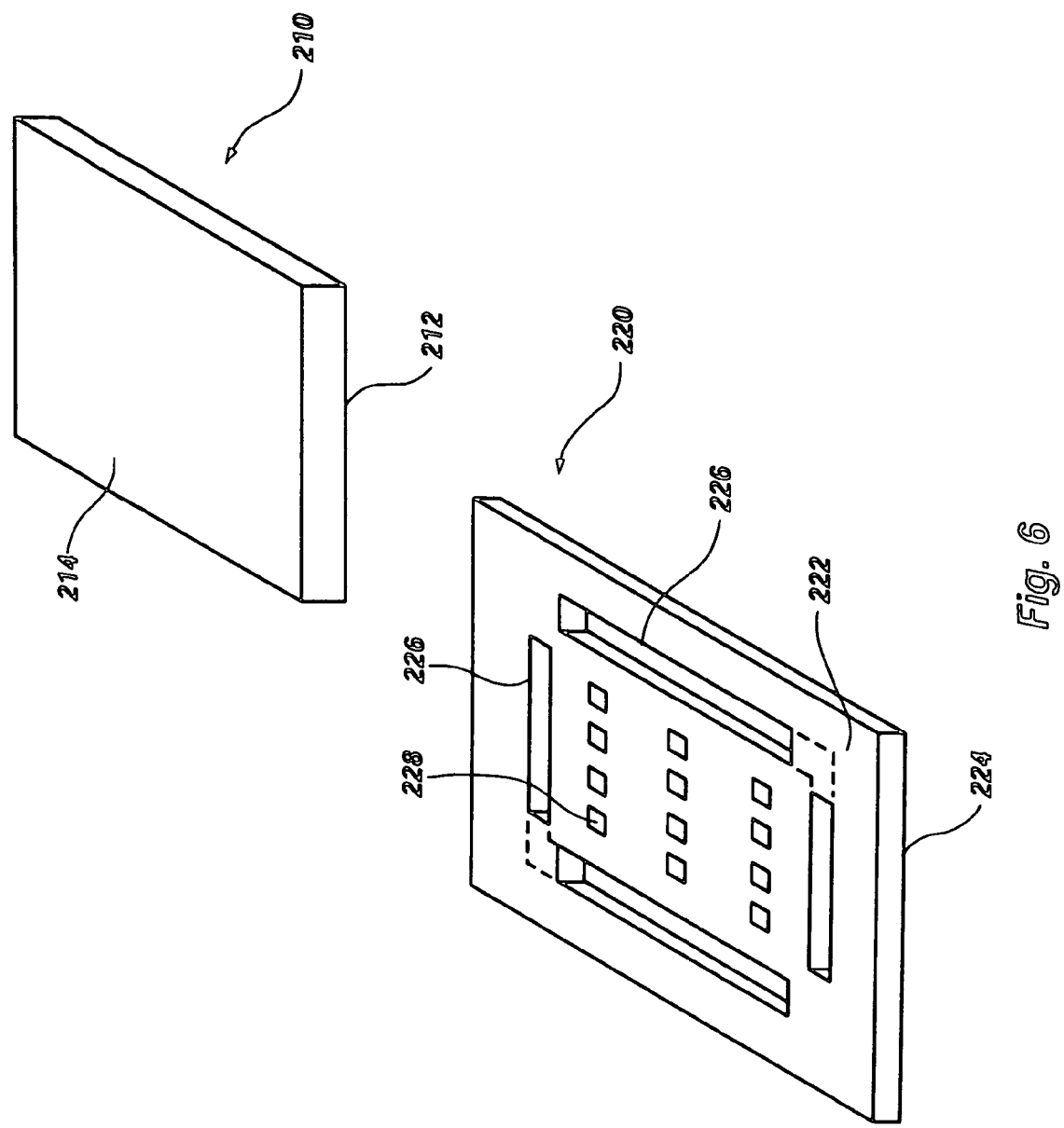
Figure 7:
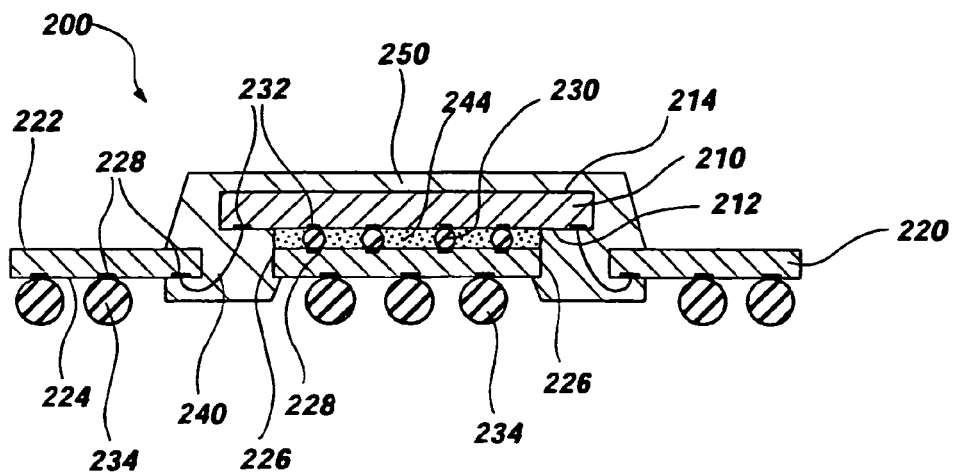
Figure 8:
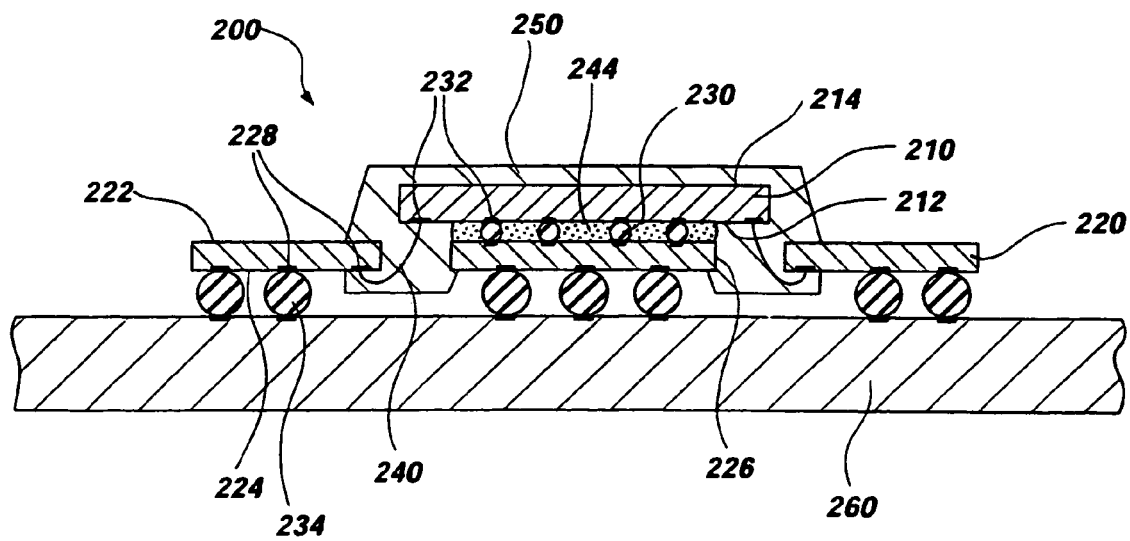

A second embodiment of the present invention is depicted in drawing FIGS. 6 through 8. The second embodiment, as illustrated in drawing FIG. 6, includes a semiconductor die 210 having an active surface 212 and a back surface 214 and a carrier substrate 220 having a first and second surface 222 and 224, as in the first embodiment. However, in the second embodiment, the carrier substrate 220 includes multiple openings 226. In particular, the openings 226 are preferably located proximate a periphery of the carrier substrate 220 or, rather, the openings 226 are sized and configured to substantially outline the semiconductor die periphery when the semiconductor die 210 is attached to the carrier substrate 220. Each of the openings 226 extends through the first surface 222 of the carrier substrate 220 to the second surface 224 of the carrier substrate 220. Adjacent openings 226 of the substrate 220 of the at least one semiconductor assembly 210 may extend proximate more than one side of a periphery of the substrate 220 (shown in dashed lines).

Depicted in drawing FIG. 7 is the semiconductor assembly 200 of the second embodiment. As shown, the semiconductor die 210 includes bond pads 232 on its active surface 212. Specifically, the bond pads 232 interconnecting with the conductive bumps 230 are arranged centrally on the active surface 212 of the semiconductor die 210 and the bond pads 232 interconnecting with the bond wires 240 are aligned proximate the die periphery on the active surface 212 of the semiconductor die 210.

The semiconductor die 210, with its active surface 212 face down, is attached to the first surface 222 of the carrier substrate 220. Similar to the first embodiment, the semiconductor die 210 is electrically interconnected to the carrier substrate 220 with conductive bumps 230 and bond wires 240. However, the bond wires 240 are interconnected to bond pads 232 on the semiconductor die 210 at a periphery portion of the active surface 212 of the semiconductor die 210. The bond wires 240 extend from the periphery portion of the active surface 212 through the openings 226 of the carrier substrate 220 to bond pads 228 on the second surface 224 of the carrier substrate 220. With this arrangement, the semiconductor die 210 and the carrier substrate 220 are electrically interconnected by both the conductive bumps 230 and the bond wires 240. As in the first embodiment, the second embodiment may include a filler material 244 and an encapsulation material 250 for encapsulating particular components of the semiconductor assembly 200. Further, the second embodiment also includes interconnect bumps 234 on the second surface 224 of the carrier substrate 220. With the interconnect bumps 234, the semiconductor assembly 200 may be electrically interconnected to another substrate such as a printed circuit board 260, as shown in drawing FIG. 8.

According to the present invention, both the conductive bumps 230 and the bond wires 240 share in the electrical interconnection between the semiconductor die 210 and the carrier substrate 220. In particular, the present invention provides that the conductive bumps 230 include the power and ground connections and the difficult signal routes between the semiconductor die 210 and the carrier substrate 220. In this manner, both the conductive bumps 230 and the plurality of bond wires 240 include a portion of the signal routing between the semiconductor die 210 and the carrier substrate 220. Therefore, by arranging the conductive bumps 230 and the bond wires 240 to share in the electrical interconnection between the semiconductor die 210 and substrate 220, there is additional space on the semiconductor die 210 for bond pads used for bond wires 240 and/or the additional space allows for a smaller die size. Furthermore, since the present invention requires conductive bumps 230 for only the power and ground connections and the difficult signal routing connections, the number of conductive bumps 230 is limited, thereby providing a more efficient aligning process with the bond pads 228 of the substrate 220 without the high probability for alignment error as found in conventional flip-chip aligning processes.

The semiconductor assembly 100 of the first embodiment and the semiconductor assembly 200 of the second embodiment are each contemplated for use within a computer system. For example, the semiconductor assembly 100, 200 of the present invention can be used to clear the memory devices of a computer system or to implement a memory storage device of a computer system. Other types of implementation may incorporate a processing unit that provides the main functions of operation within either a computer system or any preferable implantation processing capabilities such as a video card or any other preferable device. Drawing FIG. 9 is an example in which the semiconductor assembly 100, 200 of the present invention may be integrated into a computer system.

Figure 9:
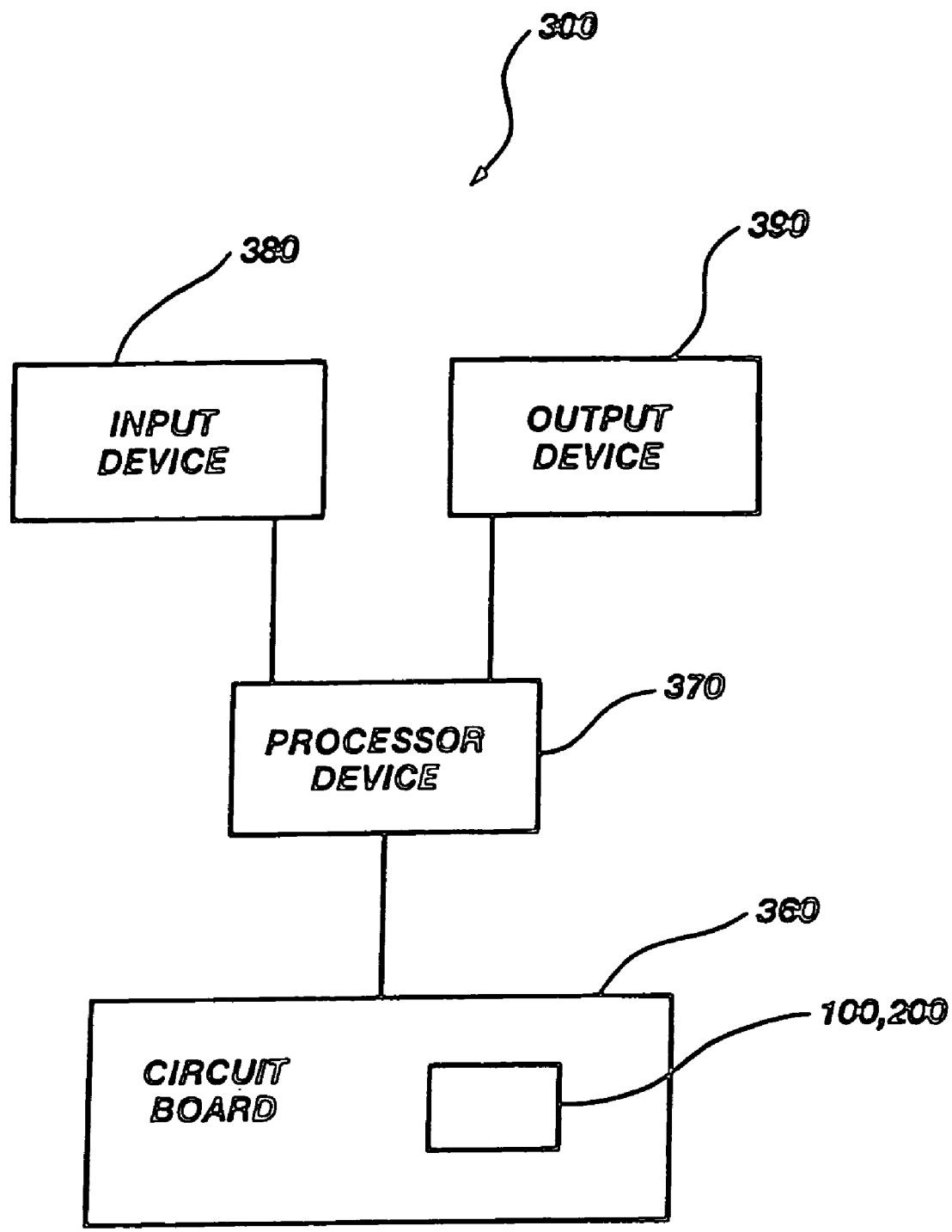
FIG. 9 is a simplified block diagram of the semiconductor assembly of the present invention integrated in a computer system.

As illustrated in block diagram form in drawing FIG. 9, there is the semiconductor assembly 100, 200 of the present invention mounted to a circuit board 360 in a computer system 300. In the computer system 300, the circuit board 360 is connected to a processor device 370 that communicates with an input device 380 and an output device 390. The input device 380 may be a keyboard, mouse, joystick or any other computer input device. The output device 390 may be a monitor, printer or storage device, such as a disk drive, or any other output device. The processor device 370 may be, but is not limited to, a microprocessor or a circuit card including hardware for processing computer instructions. Additional preferable structure for the computer system 300 would be readily apparent to those skilled in the art.

The above descriptions and drawings are only illustrative of preferred embodiments which achieve the objects, features and advantages of the present invention, and it is not intended that the present invention be limited thereto. Any modification of the present invention which comes within the spirit and scope of the following claims is considered part of the present invention.

What is claimed is:

1. A semiconductor package including:
   a substrate having a first surface, a second surface and at least one opening therethrough;
   a semiconductor device having a surface having bond pads thereon, the surface of the semiconductor device having bond pads thereon contacting the first surface of the substrate;

a plurality of bond wires extending through the at least one opening in the substrate from a first group of bond pads of the semiconductor device to the second surface of the substrate and a plurality of conductive bumps located between another group of bond pads of the semiconductor device and the first surface of the substrate;

filler material located between the second surface of the substrate and the surface of the semiconductor device having bond pads thereon; and encapsulant material covering a portion of the semiconductor device and the plurality of bond wires and substrate extending through the at least one opening in the substrate.

2. The semiconductor package of claim 1, wherein the plurality of conductive bumps comprise one of solder balls or stud bumps or z-axis conductive material.

3. The semiconductor package of claim 1, wherein the plurality of conductive bumps comprise power and ground connections between the semiconductor die and the substrate.

4. The semiconductor package of claim 1, wherein the plurality of conductive bumps comprise a portion of signal routing between the semiconductor die and the substrate.

5. The semiconductor package of claim 1, wherein the plurality of bond wires and the plurality of conductive bumps comprise signal routing between the semiconductor die and the substrate.

6. The semiconductor package of claim 1, further comprising interconnect bumps disposed on the second surface of the substrate.

7. The semiconductor package of claim 6, wherein the interconnect bumps interconnect with a printed circuit board.

8. The semiconductor package of claim 1, wherein the at least one opening is substantially centrally located in the substrate.

9. The semiconductor package of claim 8, wherein the semiconductor die is attached to the substrate having centrally located bond pads on the semiconductor die exposed through the at least one opening and outer bond pads on the semiconductor die are mirrored with bond pads on the first surface of the substrate having the plurality of conductive bumps therebetween.

10. The semiconductor package of claim 1, wherein the at least one opening comprises a plurality of openings extending proximate more than one side of a substrate periphery.

11. The semiconductor package of claim 1, wherein the at least one opening extends proximate more than one side of a substrate periphery.

12. The semiconductor package of claim 11, wherein the semiconductor die is attached to the substrate having peripheral bond pads on the semiconductor die exposed through a plurality of openings and centrally located bond pads are mirrored with bond pads on the first surface of the substrate having the plurality of conductive bumps therebetween.

13. The semiconductor package of claim 1, wherein the plurality of conductive bumps comprises power and ground connections between the semiconductor die and the substrate.

14. The semiconductor package of claim 1, wherein the plurality of conductive bumps comprises a portion of signal routing between the semiconductor die and the substrate.

15. The semiconductor package of claim 1, wherein the at least one opening extends proximate more than one side of a substrate periphery.

16. The package of claim 15, wherein the semiconductor die is attached to the substrate having peripheral bond pads on the semiconductor die exposed through the plurality of openings and centrally located bond pads are mirrored with bond pads on the first surface of the substrate having the plurality of conductive bumps therebetween.

17. A package having an interconnection between an active surface of a semiconductor die attached to a substrate having a first surface, a second surface and at least one opening extending therethrough, the package comprising:

a plurality of bond wires extending through the at least one opening in the substrate and bonded from the active surface of the semiconductor die to the second surface of the substrate and a plurality of conductive bumps disposed between the active surface of the semiconductor die and the first surface of the substrate, filler material located between the first surface of the substrate and the active surface of the semiconductor die having bond pads thereon, and encapsulant material covering a portion of the semiconductor die, the plurality of bond wires, and extending through the opening in the substrate.

18. The package of claim 17, wherein the plurality of conductive bumps comprises one of solder balls and stud bumps and z-axis conductive material.

19. The package of claim 17, wherein the plurality of bond wires and the plurality of conductive bumps comprise signal routing between the semiconductor die and the substrate.

20. The package of claim 17, further comprising interconnect bumps disposed on the second surface of the substrate.

21. The package of claim 20, wherein the interconnect bumps interconnect with a printed circuit board.

22. The package of claim 17, wherein the at least one opening is substantially centrally located in the substrate.

23. The package of claim 22, wherein the semiconductor die is attached to the substrate having centrally located bond pads on the semiconductor die exposed through the at least one opening and outer bond pads on the semiconductor die are mirrored with bond pads on the first surface of the substrate having the plurality of conductive bumps therebetween.

24. The package of claim 17, wherein the at least one opening comprises a plurality of openings extending proximate more than one side of a substrate periphery.

25. A packaging method for a substrate having a first surface, a second surface and at least one opening therethrough and a semiconductor device having an active surface and a back surface comprising:

disposing a plurality of conductive bumps between the active surface of the semiconductor device and the first surface of the substrate;

disposing a plurality of bond wires extending through the at least one opening in the substrate from the active surface of the semiconductor die to the second surface of the substrate;

disposing filler material between the first surface of the substrate and the active surface of the semiconductor device; and disposing encapsulant material on a portion of the semiconductor device and the plurality of bond wires and through the opening in the substrate.

26. The packaging method of claim 25 further comprising reflowing the plurality of conductive bumps.

27. The packaging method of claim 25, wherein the disposing the plurality of conductive bumps comprises arranging the plurality of conductive bumps with power and ground connections between the semiconductor die and the substrate.

28. The packaging method of claim 25, wherein the disposing the plurality of conductive bumps comprises arranging the plurality of conductive bumps with signal routing connections between the semiconductor die and the substrate.

29. The packaging method of claim 25, further comprising bonding interconnect bumps to the second surface of the substrate.

30. The packaging method of claim 29, further comprising attaching the interconnect bumps to a printed circuit board.

31. The packaging method of claim 30, further comprising disposing filler material between the second surface of the substrate and the printed circuit board.

32. A computer system having a circuit board connected thereto comprising:
- at least one semiconductor assembly mounted to the circuit board, the at least one semiconductor assembly comprising:
  - a substrate having a first surface, a second surface and at least one substantially centrally located opening therethrough, the at least one substantially centrally located opening in the substrate extending from the first surface to the second surface of the substrate;
  - a semiconductor die having an active surface and a back surface, the active surface of the semiconductor die attached to the first surface of the substrate;
  - a plurality of bond wires extending through the at least one substantially centrally located opening in the substrate and bonded from the active surface of the semiconductor die to the second surface of the substrate;
  - an encapsulant material covering a portion of the semiconductor die and a portion of the plurality of bond wires and extending through the opening in the substrate;
  - a plurality of conductive bumps disposed between the active surface of the semiconductor die and the first surface of the substrate; and
  - filler material located between the first surface of the substrate and the active surface of the semiconductor die.

33. The computer system of claim 32, further comprising a processor device electrically connectable to the at least one semiconductor assembly.

34. The computer system of claim 33, further comprising an input device electrically connectable to the processor device.

35. The computer system of claim 33, further comprising an output device electrically connectable to the processor device.

36. The computer system of claim 32, wherein the plurality of conductive bumps comprises power and ground connections between the semiconductor die and the substrate.

37. The computer system of claim 32, wherein the plurality of conductive bumps comprises a portion of signal routing between the semiconductor die and the substrate.

38. The computer system of claim 32, wherein the plurality of bond wires and the plurality of conductive bumps comprise signal routing between the semiconductor die and the substrate.

39. The computer system of claim 32, wherein the at least one semiconductor assembly further comprises interconnect bumps disposed on the second surface of the substrate.

40. The computer system of claim 39, wherein the interconnect bumps interconnect with the circuit board.

41. The computer system of claim 32, wherein a filler material is disposed between the second surface of the substrate and the circuit board.

42. The computer system of claim 32, wherein the at least one opening of the substrate of the at least one semiconductor assembly is substantially centrally located in the substrate.

43. The computer system of claim 42, wherein the semiconductor die is attached to the substrate having centrally located bond pads on the active surface of the semiconductor die exposed through the at least one opening and outer bond pads on the active surface of the semiconductor die are mirrored with bond pads on the first surface of the substrate having the plurality of conductive bumps therebetween.

* * * * *

UNITED STATES PATENT AND TRADEMARK OFFICE
CERTIFICATE OF CORRECTION

| | | |
|---|---|---|
| PATENT NO. | : 7,629,686 B2 | Page 1 of 1 |
| APPLICATION NO. | : 11/523915 | |
| DATED | : December 8, 2009 | |
| INVENTOR(S) | : Larry D. Kinsman | |

It is certified that error appears in the above-identified patent and that said Letters Patent is hereby corrected as shown below:

In column 10, line 58, in Claim 26, after "claim 25" insert -- , --.

In column 12, line 23, in Claim 41, delete "claim 32," and insert -- claim 40, --, therefor.

Signed and Sealed this

Sixteenth Day of February, 2010

David J. Kappos
*Director of the United States Patent and Trademark Office*